United States Patent [19]
Schleifer

[11] Patent Number: 6,118,828
[45] Date of Patent: Sep. 12, 2000

[54] DIGITAL SUPER-REGENERATIVE DETECTOR RF RECEIVER

[75] Inventor: Fred Freybler Schleifer, Appleton, Wis.

[73] Assignee: The Chamberlain Group, Inc., Elmhurst, Ill.

[21] Appl. No.: 08/907,469

[22] Filed: Aug. 8, 1997

Related U.S. Application Data

[63] Continuation-in-part of application No. 08/882,662, Jun. 25, 1997, abandoned, which is a continuation of application No. 08/461,425, Jun. 5, 1995, abandoned.

[51] Int. Cl.[7] .................................................. H04L 25/06
[52] U.S. Cl. ...................... 375/317; 340/825.69; 341/176
[58] Field of Search .................... 375/219, 316, 375/317, 318; 340/825.57, 825.53, 825.61, 825.69; 341/176

[56] References Cited

U.S. PATENT DOCUMENTS

| | | |
|---|---|---|
| 3,665,475 | 5/1972 | Gram . |
| 3,716,865 | 2/1973 | Willmott . |
| 3,746,999 | 7/1973 | Freen . |
| 3,906,348 | 9/1975 | Willmott . |
| 4,037,201 | 7/1977 | Willmott . |
| 4,529,980 | 7/1985 | Liotine . |
| 4,535,333 | 8/1985 | Twardowski . |
| 4,638,443 | 1/1987 | Schindler . |
| 5,621,756 | 4/1997 | Bush et al. . |

OTHER PUBLICATIONS

Whitehead, J.R., "Super–Regenerative Receivers," Cambridge at the University Press, 1950.

*Primary Examiner*—Don N. Vo
*Attorney, Agent, or Firm*—Fitch, Even, Tabin & Flannery

[57] ABSTRACT

A digital super-regenerative receiver has an analog RF detector and a regenerative oscillator. An output signal of the analog RF detector is used to generate a digital signal from which an oscillator bias is adjusted in order to maintain the oscillator start-up time at a fixed level. The circuit senses through the use of a multi-level threshold detector if the start-up time is earlier or later than the predetermined start-up time and produces an output signal when the majority of the start times are ahead of the expected start time.

6 Claims, 20 Drawing Sheets

DIGITAL SUPER-REGENERATIVE DETECTOR RF RECEIVER

CROSS REFERENCE TO RELATED APPLICATIONS

This is a continuation-in-part of U.S. application Ser. No. 08/882,662, filed Jun. 25, 1997, now abandoned, which is a continuation of abandoned U.S. application Ser. No. 08/461,425, filed Jun. 5, 1995.

BACKGROUND OF THE INVENTION

The invention relates in general to a receiver for security systems which allows operation upon the receipt of a properly coded signal. More particularly, the invention relates to a digital super-regenerative receiver for a security system or to a barrier operator system, such as a garage door operator, employing a transmitter and a receiver.

It is well-known to provide radio-controlled garage door operators which include a garage door operator unit having a radio receiver and a motor connected to be driven from the radio receiver. The radio receiver is adapted to receive radio frequency signals or other electromagnetic signals having particular signal characteristics which, when received, cause the door to be opened. More recently, such transmitter and receiver systems have become relatively more sophisticated in that they use radio transmitters which employ coded transmissions composed of pulse width modulated signals to which may be assigned multiple three-values (0, 1 and 2), also known as "trinary bits" or other serial coded transmission techniques. Once such signals are received, a microcontroller is generally used to decode the trinary word.

Analog super-regenerative receivers have been known for use in such systems. Super-regeneration is a form of regenerative amplification. In a regenerative receiver, a detector is provided having positive or regenerative feedback from the output to the input. The feedback must maintain operation of the oscillator on the verge of oscillation. In a super-regenerative detector, the circuit is switched into and out of oscillation by an oscillator operating at a very low frequency rate, called the "quench" frequency. The quench frequency is lower than the carrier frequency but higher than the frequency of the modulating signal. That is, the oscillator allows oscillations to build up in the regenerative circuit and then causes them to die out.

In the absence of an incoming signal, oscillations are initiated by thermal noise, build up to a critical amplitude and die out. An incoming signal larger than the thermal noise advances the build up time. Thus, the peak is reached sooner, and the oscillations die out sooner. The frequency of interruption increases with signal strength. A detector will provide indication of the incoming signal based on the advance of the build up period.

Super-regenerative receivers provide greater sensitivity than other types of receivers. However, most analog super-regenerative receivers require a large number of analog components that are not easily integrated or incorporated into an application-specific integrated circuit (ASIC). As such, manufacturing costs are relatively high. In addition, such super-regenerative receivers require relatively high current to operate. Thus, they consume more power and decrease battery life. In addition, such super-regenerative receivers do not generally decode trinary word encoded signals themselves. Rather, a separate microcontroller is used, which must be kept constantly on. Even if the microcontroller is maintained at a lower-running clock speed, it will still draw current and hence decrease battery life. Also, many super-regenerative receivers require an audio amplifier, thereby increasing system complexity, cost and power consumption. Finally, many super-regenerative receivers are sensitive to variations in transistor characteristics.

Accordingly, there is a need for a relatively simple super-regenerative receiver that requires relatively low current and hence draws less power than previous receivers. There is a further need for a super-regenerative receiver that tracks the received signal more quickly than other receivers.

SUMMARY OF THE INVENTION

Accordingly, it is an object of the invention to provide a super-regenerative receiver that tracks more quickly than other receivers and that draws less power than other receivers.

It is a further object of the present invention to provide a super-regenerative receiver that is relatively insensitive to transistor characteristics.

It is a still further object of the present invention to provide a super-regenerative receiver that does not require an audio amplifier.

In accordance with one embodiment of the invention, a digital super-regenerative receiver is provided having an analog RF detector and a regenerative oscillator. The output of the RF detector is used to generate a digital signal from which the oscillator bias is adjusted, in order to maintain the oscillator start-up time at a fixed level. The circuit senses if the start-up time is earlier or later than the predetermined start-up time and produces an output signal when the majority of the start times are ahead of the expected start time.

DETAILED DESCRIPTION OF THE PREFERRED EMBODIMENTS

Figure 1:
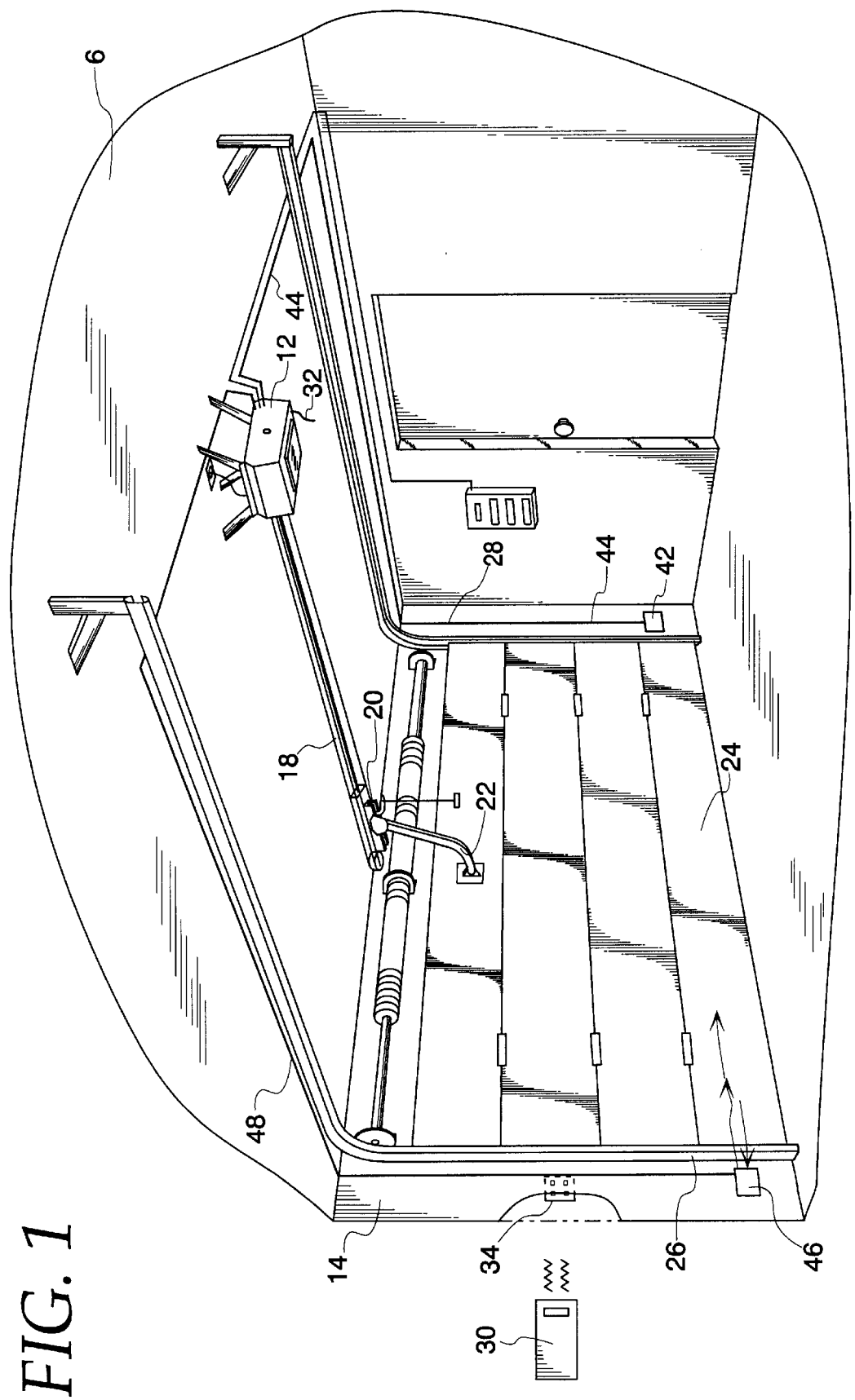
FIG. 1 is a perspective view of an apparatus for moving a barrier or garage door embodying the present invention.

Referring now to the drawings and especially to FIG. 1, a movable barrier door operator or garage door operator is generally shown therein and identified by numeral 10. The movable barrier operator 10 includes a head unit 12 mounted to a ceiling 6 of a garage 14. The head unit 12 includes a rail 18 extending therefrom with a releasable trolley 20 attached having an arm 22 extending to a multiple paneled garage door 24 positioned for movement along a pair of door rails 26 and 28. The apparatus may include hand-held transmitter unit 30 adapted to send signals to an antenna 32 of the head unit 12 and coupled to a receiver in the head unit as will appear hereinafter. An external control pad 34 is positioned on the outside of the garage 14 and has a plurality of buttons 35 thereon. The external control pad 34 communicates via radio frequency transmission with the antenna 32 of the head unit 12. An optical emitter 42 is connected via a power and signal line 44 to the head unit 12. An optical detector 46 is connected via a wire 48 to the head unit 12.

Figure 2:
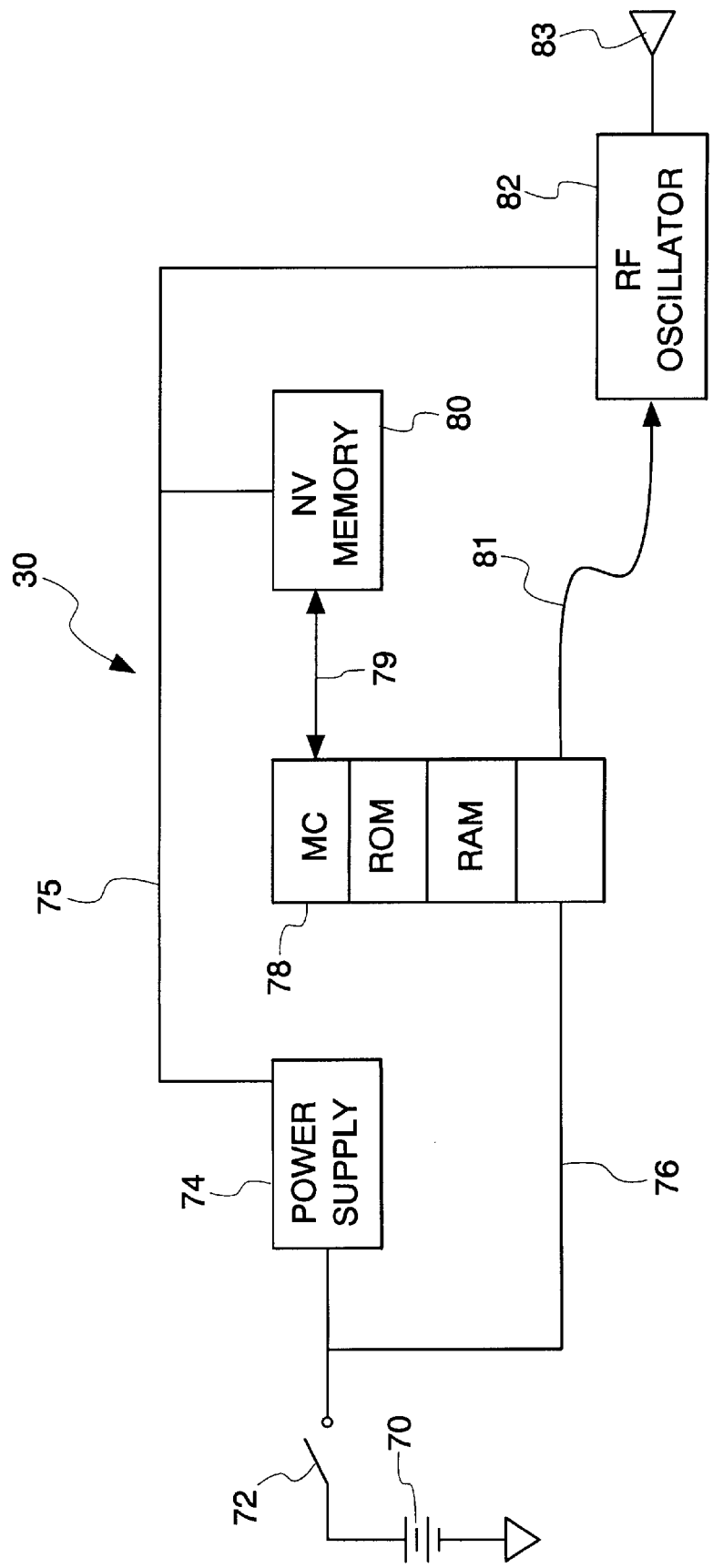
FIG. 2 is a block diagram of a transmitter for use with a garage door operator of FIG. 1.

Referring now to FIG. 2, the transmitter 30 is shown therein in general and includes a battery 70 connected by a pushbutton switch 72 to a power supply 74 which is coupled via leads 75 and 76 to a microcontroller 78. The microcontroller 78 is connected by a serial bus 79 to a non-volatile memory 80. An output bus 81 connects the microcontroller to a radio frequency oscillator 82. The microcontroller 78 produces coded signals when the button 72 is pushed causing the output of the RF oscillator 82 to be amplitude modulated to supply a radio frequency signal at an antenna 83 connected thereto.

Figure 3:
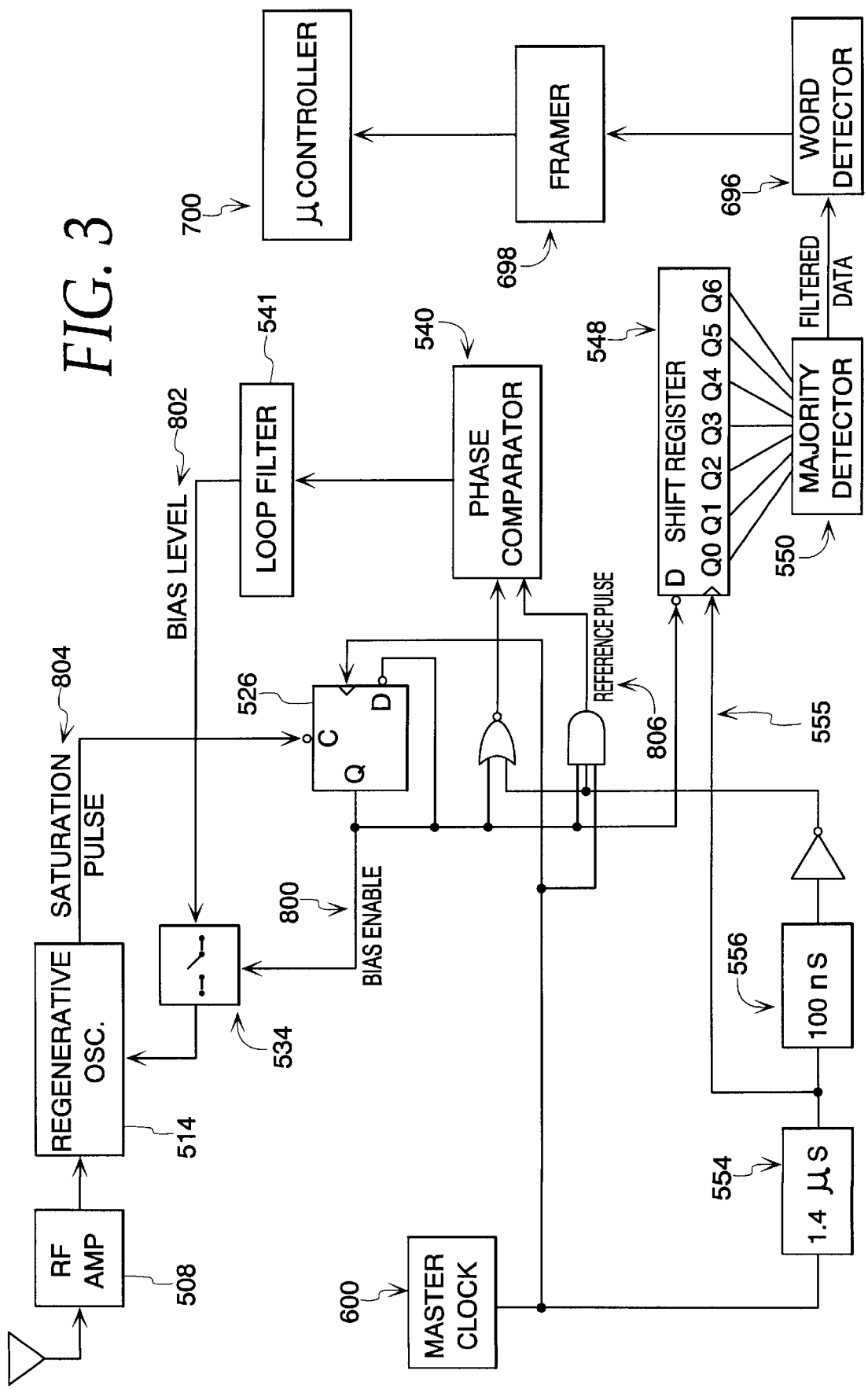
FIG. 3 is a block diagram of a receiver positioned within a head unit of the garage door operator shown in FIG. 1.

A block diagram of a receiver 601 is shown in FIG. 3. A master clock 600 enables the bias to an RF amplifier 508 and a regenerative oscillator 514. When the output of the regenerative oscillator 514 builds to saturation, it terminates via line 804 the bias enable signal 800. The start-up time of the oscillator 514 is shorter when there is a signal present than it is when only noise is present. A phase comparator 540 monitors the start-up time of the regenerative oscillator 514 and adjusts the gain of the regenerative oscillator 514 via an oscillator bias level signal carried on a line 802 such that the nominal start-up time is equal to the reference pulse 806. If the start-up time is shorter than nominal it cuts back the bias. If it is longer, it increases the bias.

The phase comparator 540 detects whether the regenerative oscillator 514 is starting sooner or later than the nominal start-up time and feeds this information to a loop filter 541 and a majority detector 550.

A shift register 548 normally clocks in logical zeroes since its clock signal carried on line 555 precedes the bias enable signal on line 800 by 100 nanoseconds. During reception of the carrier signal, the regenerative oscillator 514 starts more quickly. Thus, the shift register 548 clocks in logical ones when there is a carrier present instead of logical zeroes. The response of the loop filter 541 is slow enough so that it does not lengthen the oscillator start up time during the bit period.

The three-of-five majority detector 550 acts as a low pass filter and provides a clean output waveform with up to two corrupted input data samples at a majority detection output line 551. This output is the recovered digital signal.

A word detector 696 monitors the rising and falling edges of the three-of-five majority detector output on line 551. If it detects valid trinary word timing, it wakes the microcontroller 700 for complete code recognition. Optionally, a framer 698 may be included that reads one to two entire frames of trinary bits before waking the microcontroller 700.

Figure 4A:
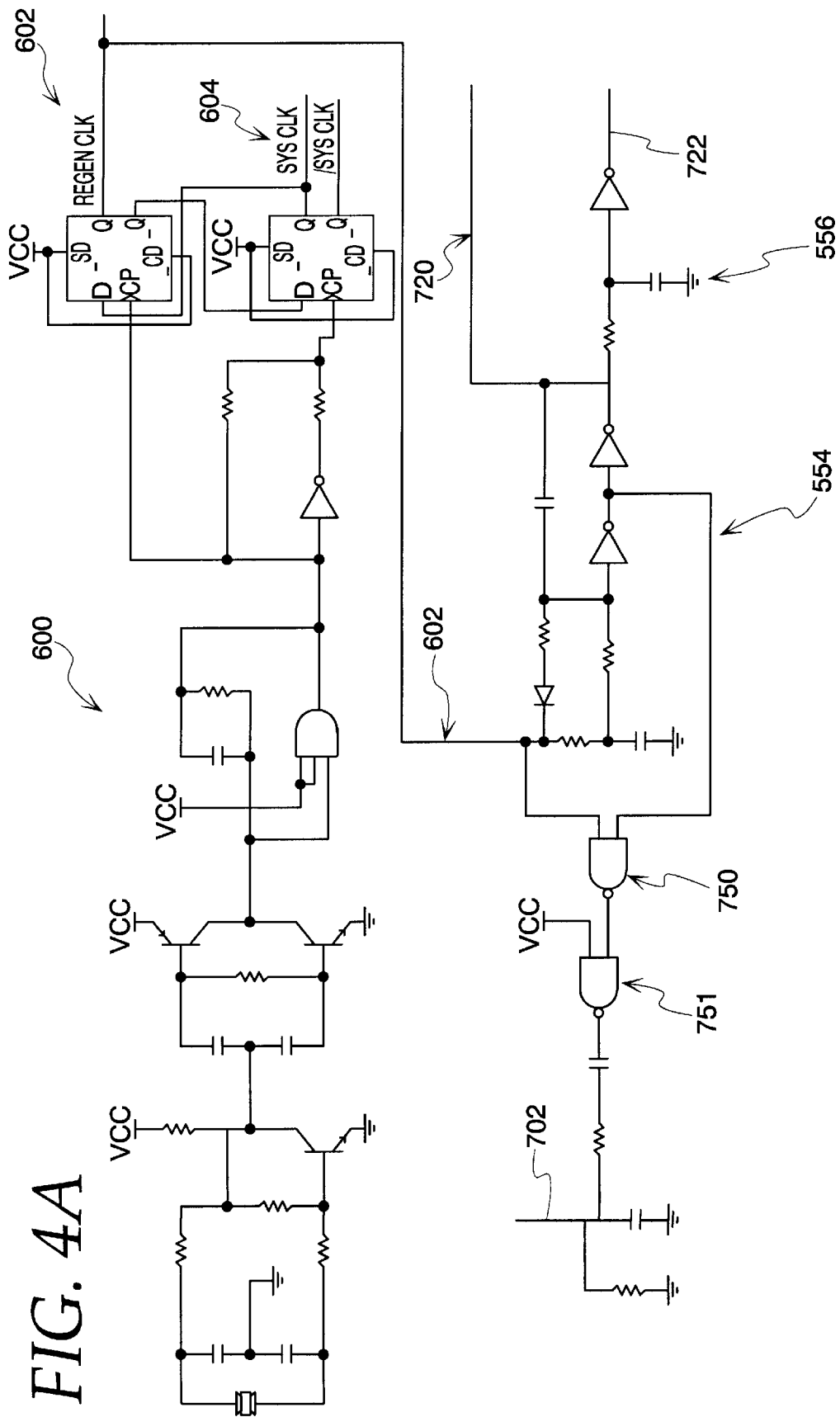
FIGS. 4A–4F are shcematic diagrams of the receiver shown in FIG. 3.
Figure 4B:
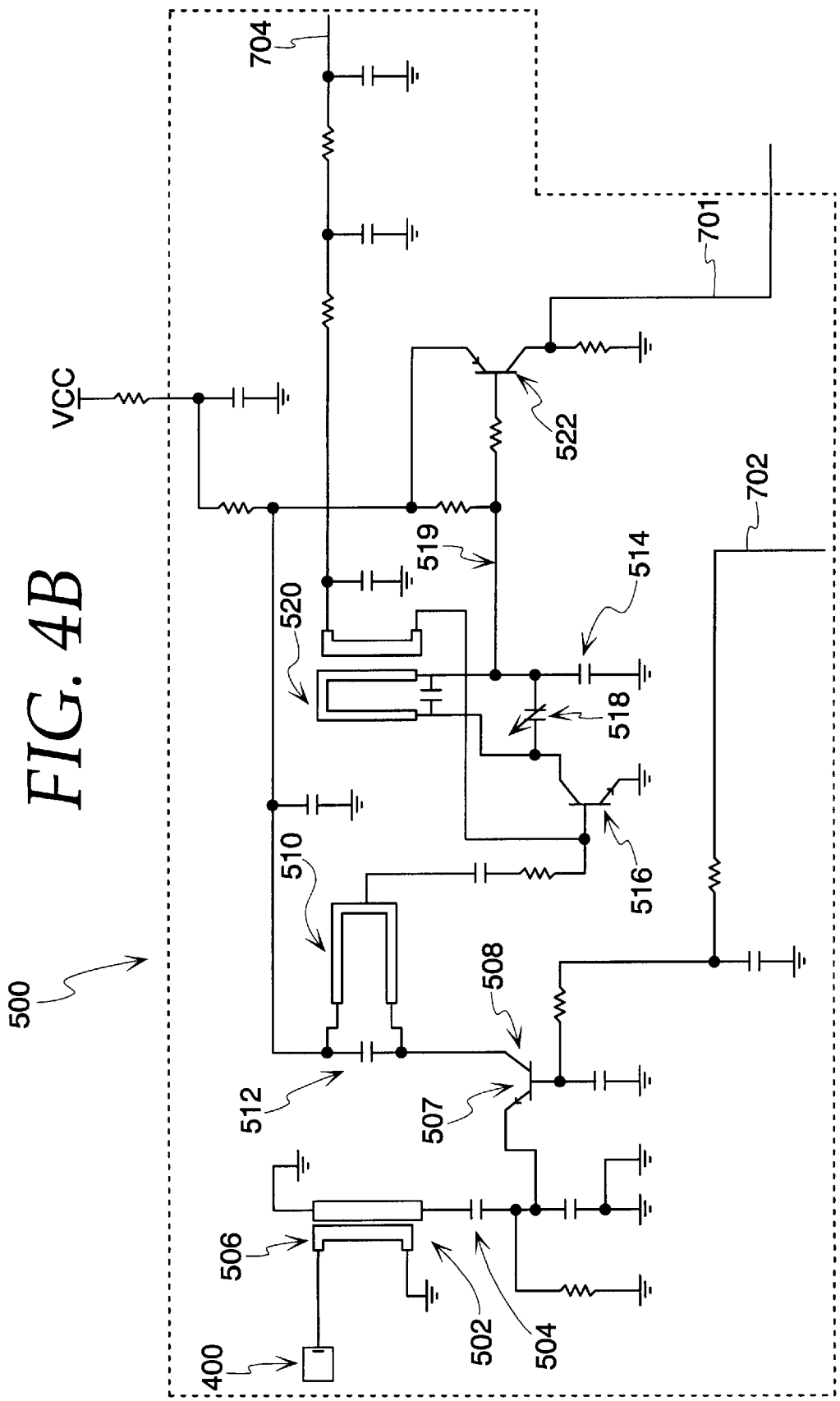

A schematic of the receiver described above is shown in FIGS. 4A–F. The clock generator 600 generates a regenerative clock signal on a line 602 and a system clock signal on a line 604 as shown in FIG. 4A. The regenerative clock signal 602 is also coupled to a 1.4 microsecond delay 554 for producing an offset 720 to the clock signal on the line 602 and a 100 nanosecond delay signal on the line 556 for producing a second offset signal 722 to the clock signal on second clock offset line 603. Delay 554 corresponds to a predetermined nominal reference start up time of the oscillator. The oscillator start up time will be shorter than the nominal time if a carrier signal is present. If only a noise signal is present, the oscillator start up time will be longer than the nominal start up time.

The delay provided by the delay signal on the line 556 on the other hand, represents a permitted signal level above noise. It allows the three-of-five majority detector 550 to filter out false logical-ones. Jitter of the regenerative oscillator start-up time due to band limited white noise may cause an unacceptable number of false logical-one bit detections. In particular, the delay represents a threshold level of one false logical-ones per ten samples. The three-of-five majority detector 550 is able to filter this level of error. It should be noted that the reference delay and the error delay are exemplary only and that use of other such parameters is within the scope of the present invention.

In response to the input digitally encoded radio frequency signal, the RF detector 500 generates a digital signal on lead 701. As may be seen in FIG. 4B, the input 400 of the RF detector 500 is coupled to a network 502 comprised of an inductor 506 and a capacitor 504. The network 502 supplies the digitally encoded RF signal to an analog buffer amplifier 507 having an NPN transistor 508 at its emitter. The buffer amplifier 507 provides a buffered radio frequency output signal to a reactive network comprising an inductor 510 and a capacitor 512. The NPN transistor 508 is coupled at its base to the clock line 602 and the delay signal line 554 via a pair of NAND gates 750 and 751 through lead 702. The buffer amplifier 507 also isolates the antenna from the noise from other portions of the super-regenerative receiver.

Figure 4C:
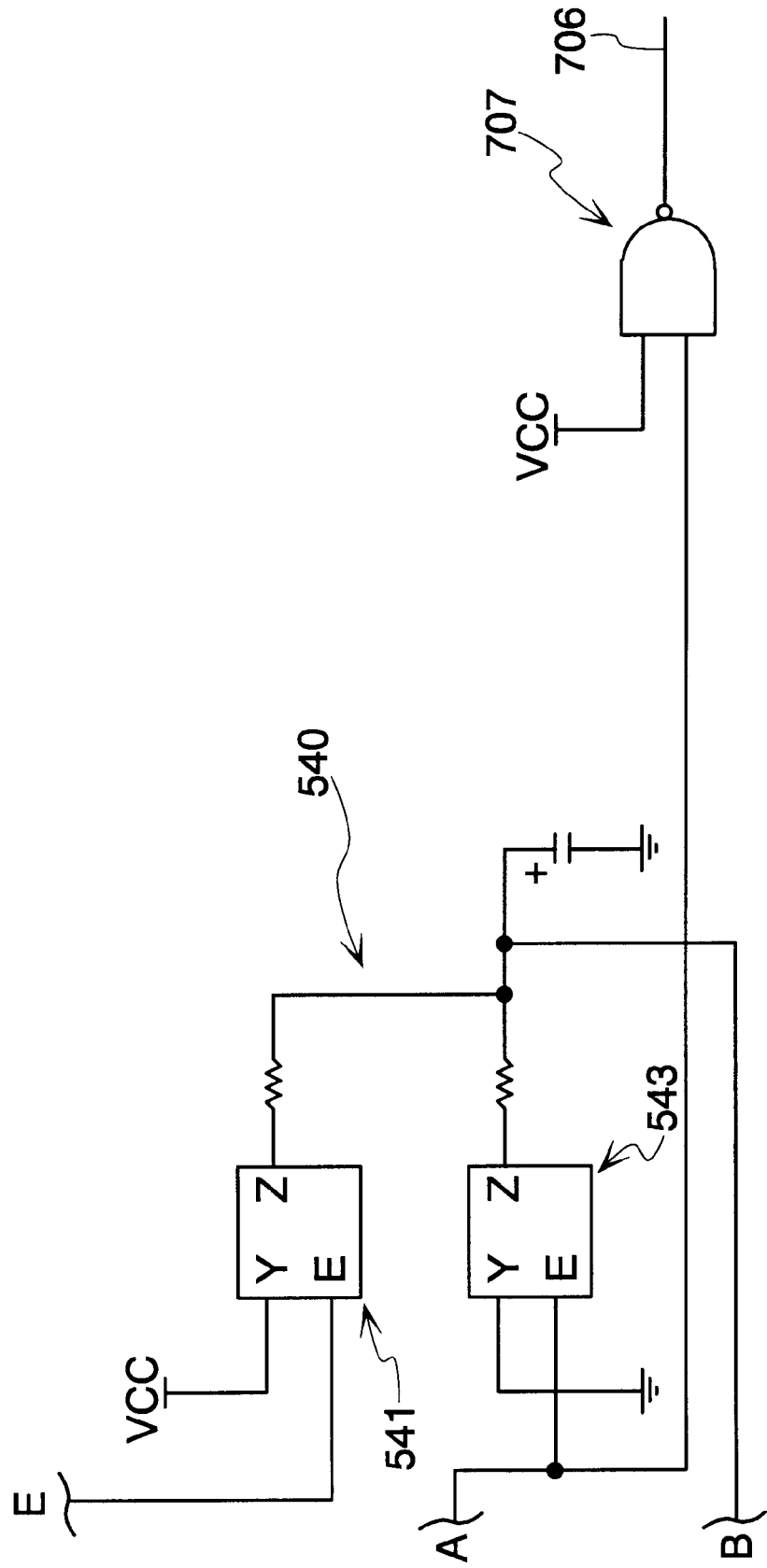

The base of the NPN transistor 508 is pulsed by the clock, turning the transistor 508 on and off in order to save power. These form part of the super-regenerative receiver and also have an inductor 520 coupled to the analog oscillator 516. The amount of feedback is adjusted using variable capacitance 518. The variable capacitance 518 and the inductor 520 form a tuned circuit tuned to be resonant at the carrier frequency. A current level detector or digital signal generator 522 receives the analog oscillator signal 519. The output of the current level detector 522 is a digital signal on lead 701. The digital signal generator 522 generates pulses which, after being inverted by an inverter 524, are delivered to a CLEAR pin 532 of a D flip-flop 526 (FIG. 4E). The regenerative clock signal carried on line 602 clocks the D flip-flop 526, which holds the digital input stable for the sampling period.

A Q output 528, the bias enable signal, of D flip-flop 526 is connected to a source 529 of a field effect transistor (FET) 534. The FET 534 acts as a switch to control the bias level of the regenerative oscillator 514 for the purpose of selectively quenching the regenerative oscillator 514 from time to time.

Figure 4D:
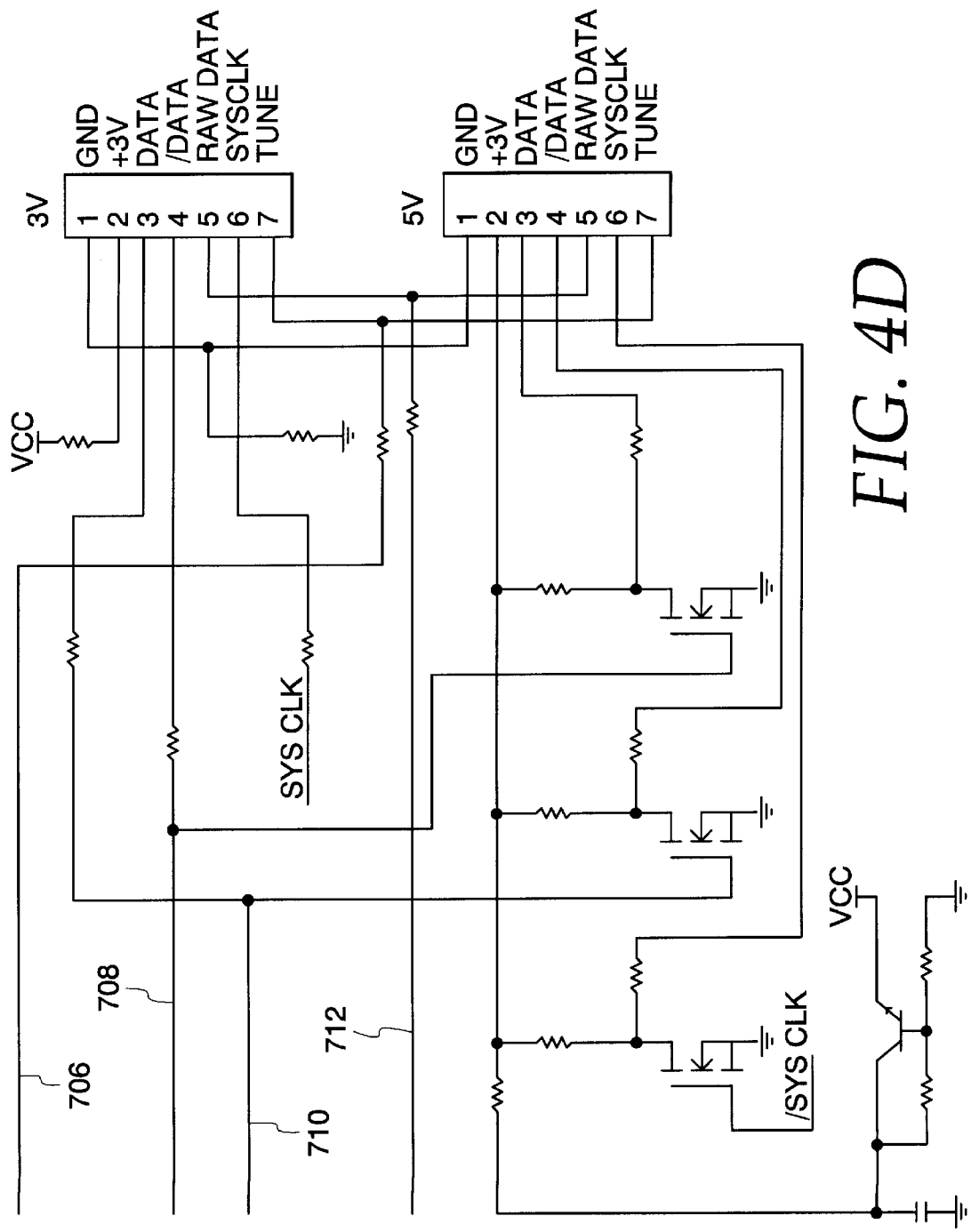
Figure 4E:
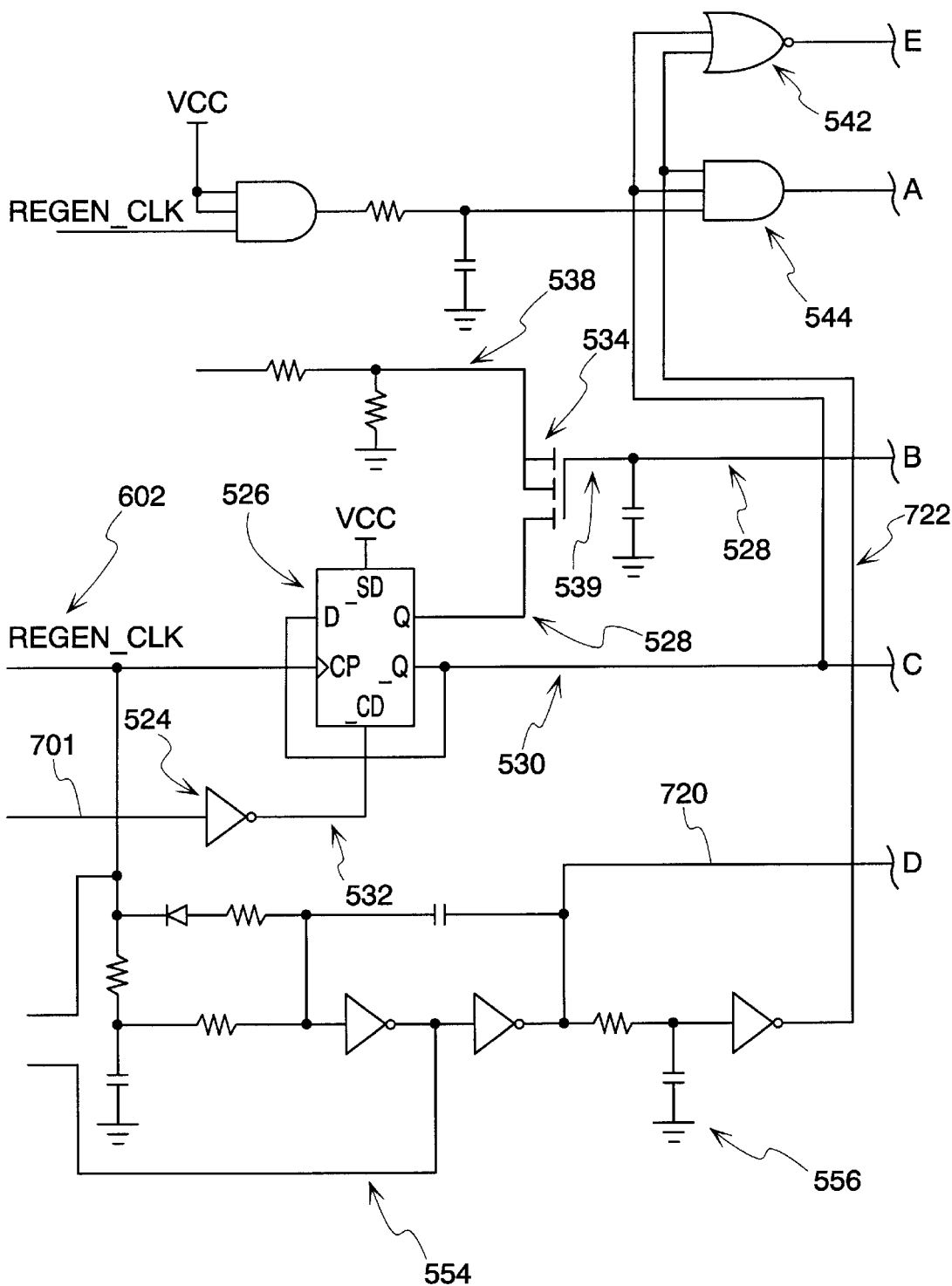
Figure 4F:
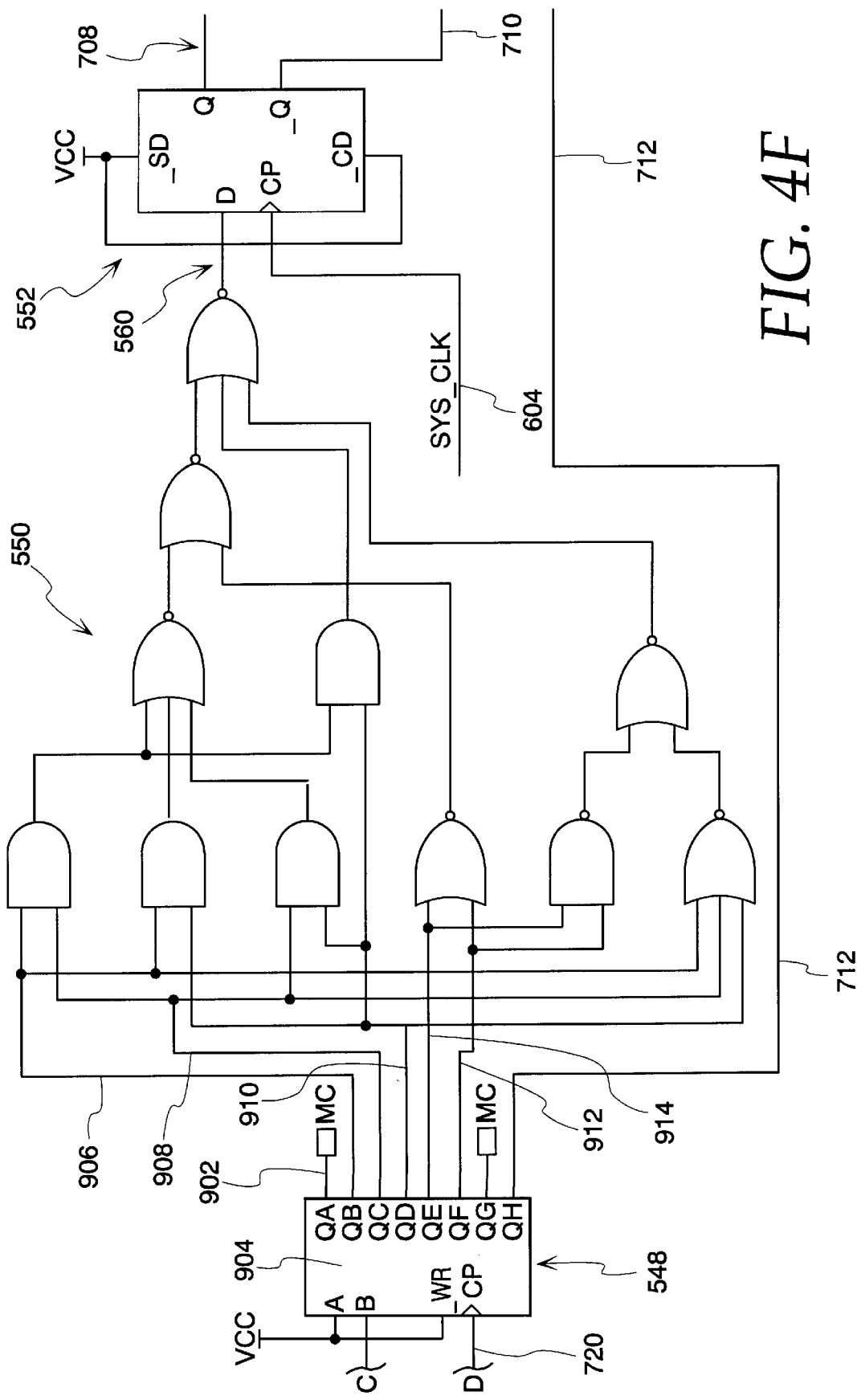

The not Q output 530 of the D flip-flop 526 is connected to the B input of the shift register 548 (FIG 4F). The shift register 548 is clocked by the regenerative clock signal supplied on regenerative clock line 602, after a 1.4 microsecond delay offset delivered on offset line 554. The offset 1.4 microsecond delay provides a nominal reference signal from which the incoming signal is detected. The not Q output 530 of the D flip-flop 526 is also connected to one input of NOR gate 542.

The other input 722 of the NOR gate 542 is connected to the regenerative clock line 602, but only after delay 554 and additional 100 nanosecond delay offset carried on line 556. The 100 nanosecond delay offset is chosen based on the desired error characteristics of the receiver system. The output of NOR gate 542 and the output of AND gate 544 are fed into a pair of quad switches 541 and 543, respectively, of the phase comparator 540 (FIG. 4C). AND gate 544 has as its inputs the regenerative clock signal carried on line 602 as well as the not Q output of D flip-flop 526 and the delayed regenerative clock signal at the output of delay 556. Thus, the phase comparator 540 compares a delayed clock signal (that is a combination of the offset clock signal resulting from both delay offset 554 and delay offset 556), with the digital signal output from digital signal generator 522, held by D flip-flop 526.

The output of phase comparator 540 is connected via lead 538 to a gate 539 of FET 534. The phase comparator 540 detects whether the regenerative oscillator signal is starting sooner or later than the nominal start-up time. If it is starting sooner, the output of the phase comparator 540—the bias level signal—will go negative and cause the FET 534 to decrease the bias to the regenerative oscillator 514 along leads 536 and 704. If the regenerative oscillator 514 starts later than the nominal start-up time, the output of the phase comparator 540 will go high, causing the bias of the regenerative oscillator 514 to decrease. That is, a combination clocked and analog bias signal is delivered to the regenerative oscillator 514 to stabilize its timing.

The output of the AND gate 544 is also coupled to the NAND gate 707, the output of which is delivered to the 3 volt and 5 volt interfaces and used for tuning as may best be seen in FIG. 4D. The digital signal on lead 530, connected to the not Q output of D flip-flop 526, is connected to the input of the shift register 548. In a preferred embodiment, the shift register 548 is an eight output 74HC164. The shift register 548 normally clocks in logical zeroes, since its clock signal precedes the falling edge of the bias enable signal by 100 nanoseconds, the error correction delay signal carried on line 556. However, when a carrier is received, the regenerative oscillator 514 starts more quickly and the shift register 548 will clock in logical ones. Thus, the shift register 548 compares the offset delay clock signal on a line 720 with the digital signal and generates a detected code.

The outputs of the shift register 548 are fed into the 3-of-5 majority detector 550. The first output 902 and the seventh output 904 are not connected. As may best be seen in FIG. 4D, the last output 712 is provided as raw data to the 3V and 5V interfaces. The 3-of-5 majority pulse detector 550 receives the coded signals from the shift register 548 and produces an accepted code signal as output when the majority of the outputs 906, 908, 910, 912 and 914 of the shift register 548 are high. That is, a positive output will result when the majority of recent regenerative oscillator start times is ahead of the nominal start time and thus, a carrier is present.

The output 560 of the three-of-five majority detector 550 is input into the D flip-flop 552, which is clocked by the system clock signal carried on the line 604. The output signals carried on lines 708 and 710 of the D flip-flop 552 are the data that is fed to the rest of the system, including the microcontroller 700 via the 3 volt and 5 volt interfaces as may best be seen in FIG. 4D.

Figure 5:
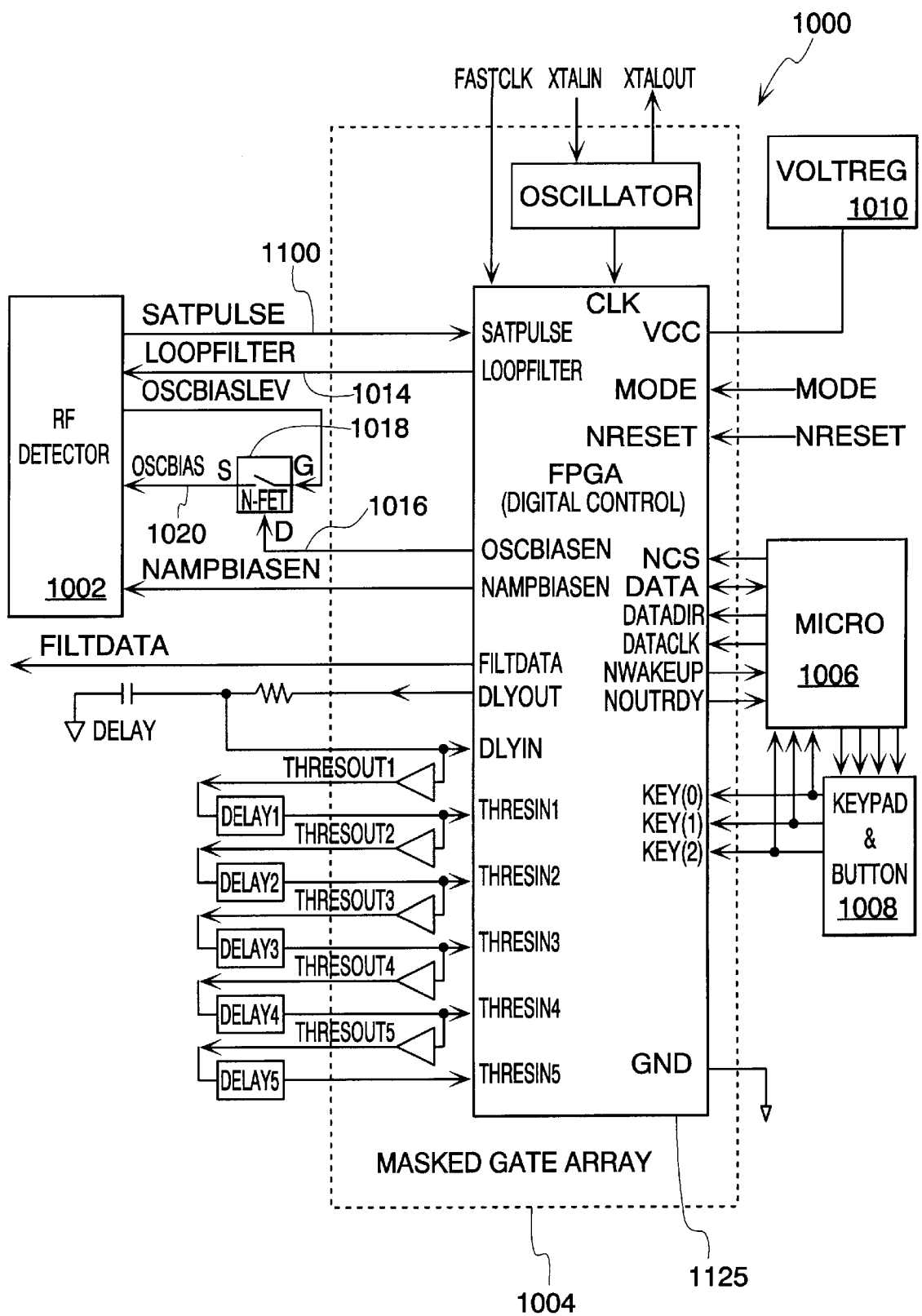
FIG. 5 is a block diagram of an alternative super-regenerative receiver system.

Referring now to FIG. 5, an apparatus 1000 comprising another embodiment of the invention has a radio frequency detector 1002 coupled to a combination digital detector and framing circuit 1004. The framing circuit provides a framed bit output to a Zilog Z86C31 8-bit microcontroller 1006 which may be actuated or controlled through a keypad or button 1008 which delivers a keypad code of four to eight digits, in addition to being controlled by an RF code.

A power supply provides current through a voltage regulator 1010 to the digital detector 1004.

The digital detector 1004 also includes portions of a threshold detector which interact with signals received from the RF detector via a saturation pulse line 1100. Signals are fed back to the RF detector via a loop filter line 1014. Enablement of oscillation in the RF detector is via signal line 1016. The signal line 1016 is connected to an n-channel field effect transistor 1018 which controls oscillator bias on a line 1020 supplied to other portions of the RF detector.

Referring now to FIGS. 6A–6H, the RF detector includes an antenna 1030 for receiving a continuous wave modulated carrier signal which is encoded in a trinary bit encoding scheme. The carrier wave which may nominally be 390 MHz or the like is switched on and off with the blank time being indicative of a low level signal and the on time being indicative of a high level signal. The relative durations of the high level and low level signals in a single pulse defines whether the pulse is to be interpreted as a zero, 1 or 2 in a trinary bit encoding scheme.

Typically a frame of trinary bit data preceded by a sync or other identifying pulse and followed either by 10 or 20 trinary bits in the form of the aforementioned duty cycle modulation of the carrier wave is transmitted from a transmitter and received by the antenna. The coded radio frequency signal may be coded according to a fixed code scheme or a rolling code scheme or some other scheme but the received signal is interpreted by other portions of the receiver to indicate that the signal being received is from either an authorized transmitter or an unauthorized transmitter.

In this embodiment the radio frequency receiver is used typically to control a lock via a motor connected to mechanical portions of the lock but may also be used to control other devices such as the motor of a garage door operator or other home security devices, automobiles or the like.

Connected to the antenna is a tuning capacitor 1032 which is adjusted to provide resonance in the antenna circuit. A pair of capacitors 1034 and 1035 couple the tuning capacitor 1032 to a fixed 47 nanohenry inductor 1036 and spread the response of the tuning circuit. These devices comprise a circuit which is resonant about the carrier frequency of the signal being received. The signal is AC- or RF-coupled through a coupling capacitor 1038 to the buffer amplifier's common base connected transistor 1040 which is connected at its emitter to the coupling capacitor 1038. A protective diode 1042 is also connected to the emitter of the buffer amplifier 1040 so that when the amplifier is enabled by a pulse on line 1016 which temporarily charges capacitor 1053b the emitter-collector circuit of transistor 1040 will not be back-biased. The bias pulse that places the transistor 1040 in the linear or amplifying region is discharged through the resistor 1057.

A regenerative oscillator 1044 is connected to the collector of the buffer amplifier transistor 1040 at its collector and has its emitter and base coupled together by an AC coupling capacitor 1050. The field effect transistor 1020 is connected to a notch filter having a response at 390 MHz, the carrier frequency, to limit unwanted radiation from the circuit traces. The notch filter comprises a resistor 1060, a capacitor 1061a and a resistor 1061b coupled to the base of the regenerative oscillator transistor 1046.

The line 1017 carries a digital signal which is fed to the drain of the field effect transistor 1018. It functions as the supply voltage to bias and thus enable and disable the regenerative oscillator transistor 1046 from oscillating. The loop filter signal on the line 1014 is supplied to the averaging circuit comprised of the resistor 1059 and the grounded capacitor 1061. The voltage at capacitor 1060 biases the gate of the FET 1018.

That gate bias voltage level controls the effective resistance in the source-drain circuit of the FET. This controls the voltage supplied by the voltage divider comprised of the FET 1018 and the grounded resistor 1021 which controls the base bias to the oscillator transistor 1046. The base bias to the transistor 1046 controls the response time from startup to saturation. A nominal response of 1.4 microseconds has been selected to provide sufficient bandwidth for the signals to be received by the antenna. In the event the oscillator starts too slowly the loop filter signal pulse will be supplied. This will increase the potential at the averaging capacitor 1060 thereby increasing the base bias of the oscillator transistor 1046 causing the oscillator 1044 to go from startup to saturation more quickly.

In response to the thresholding circuit having sensed that the oscillation amplitude of the oscillator 1044 has reached the point at which it should be quenched. The output of the oscillator 1044 is at a line 1070 and is supplied to a current level detector 1072 comprising a PNP transistor 1074 having its emitter connected via a 47 ohm resistor to a 3.3 volt source and having a current level detector output line 1100 connected to the digital detector on a saturation pulse line. The saturation pulse when supplied to the digital detector is compared by the digital detector as to its receipt time with a timing reference provided by a timing reference threshold network 1111 (FIG. 6C) comprising a plurality of RC circuits with a first RC circuit 1120, a second RC circuit 1122, a third RC circuit 1124, a fourth RC circuit 1126 and a fifth RC circuit 1128. The RC circuits are identical, each having a 4.5 kilohm resistor and a grounded 10 picofarad capacitor. The circuits are connected to a portion of the digital detector comprising a gate array 1125 (FIG. 6C) at a plurality of threshold pins so that the gate array energizes one of the RC circuits after another to provide a plurality of timing steps against which the time that the saturation pulse is received is compared.

Figure 6A:
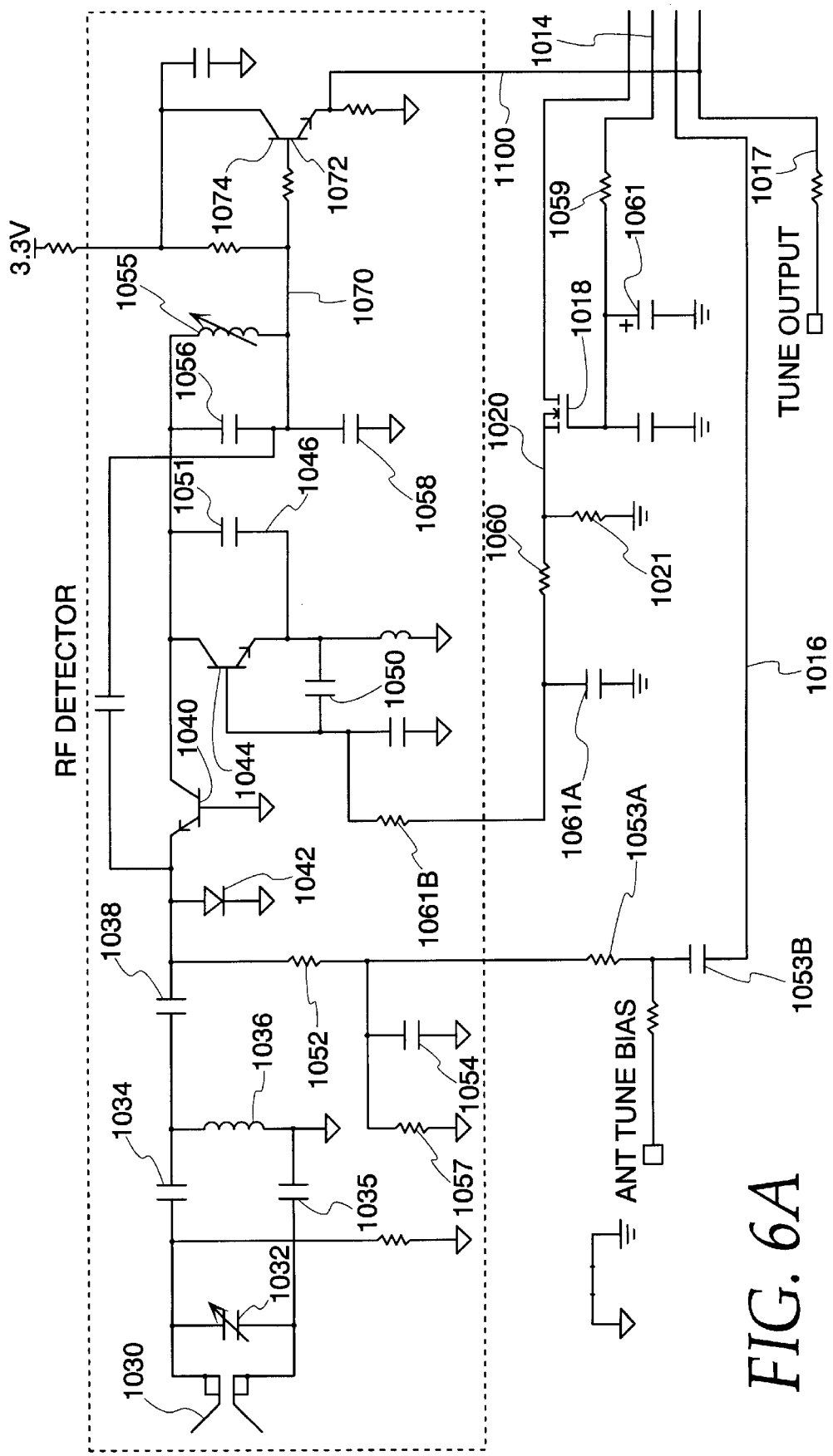
FIGS. 6A–6H are a schematic diagram of system shown in FIG. 5.
Figure 6B:
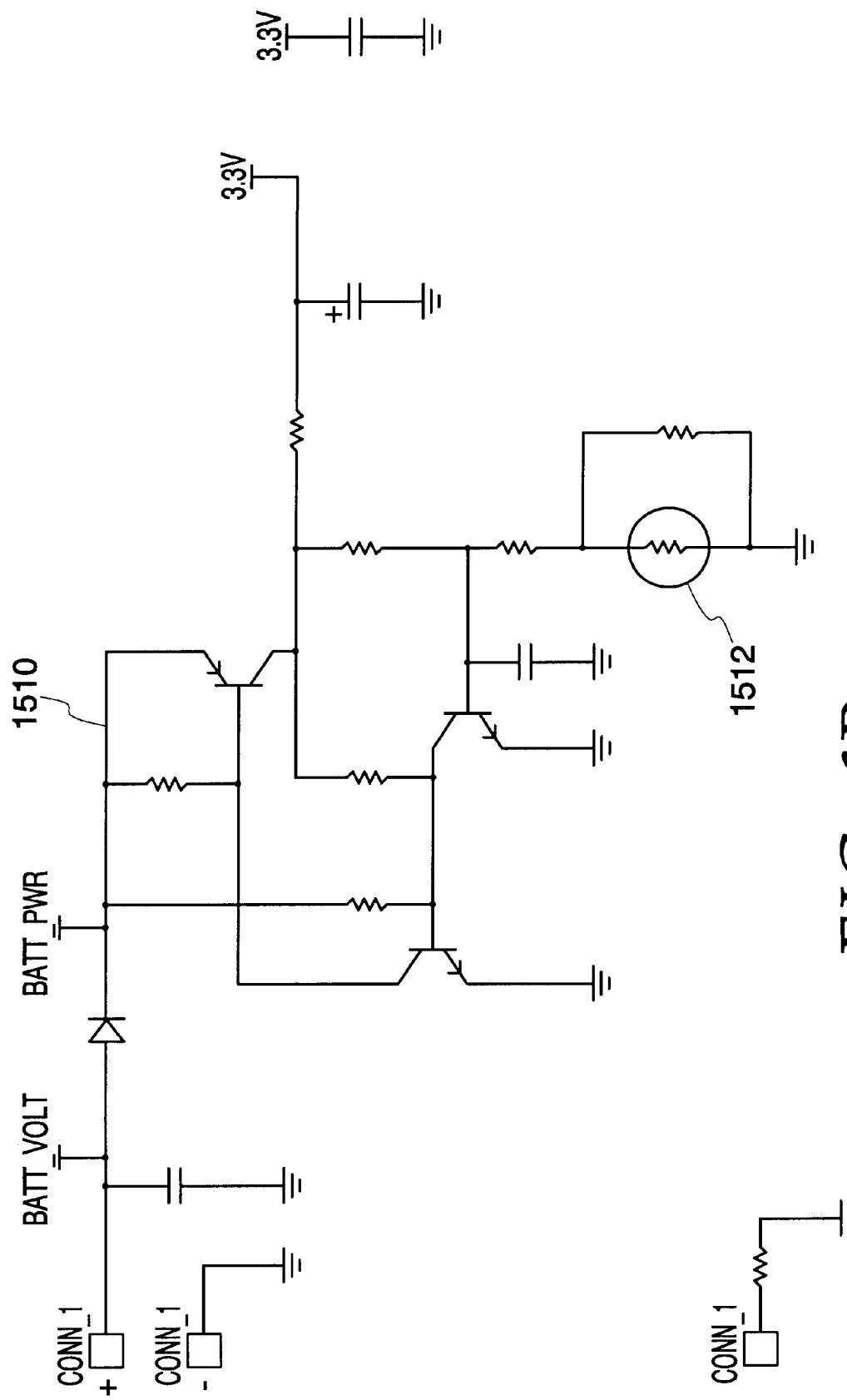

Referring back to the input of the RF detector FIG. 6A, the 1.2 picofarad capacitors 1034 and 1035 flatten the frequency response to make the frequency response of the tuned circuit including variable capacitor 1032 and inductor 1036 somewhat broader so that variations in characteristics of the antenna 1030 or changes in the antenna 1030 subsequent to manufacture will not effectively detune the antenna circuit.

The amplifier 1040 is enabled by a pulse supplied on the line 1016 causing capacitor 1053B to charge up briefly. The voltage from the charge is delivered through the resistors 1053A and 1052 to the node joining capacitor 1040 and diode 1042 to hold on the emitter of transistor 1042. This causes it to conduct and begin amplifying and thereby pass a signal to the collector of the oscillator transistor 1046. The oscillator transistor 1046 causes the oscillator 1044 to regeneratively oscillate and have its oscillations increase faster than they would simply in the presence of noise.

The capacitor 1054 then discharges through a resistor 1057 to ground shutting off the bias at the emitter of the transistor 1040 causing the amplifier 1044 to then shut off. This allows the amplifier 1040 to briefly sample from time to time the signals provided by the antenna tuning circuit and causes the amplifier to be switched on for only 1.4 microseconds at a time.

At the same time a pulse is supplied on the line 1014 to a drain of the field effect transistor 1018. The pulse causes a 100 microfarad electrolytic capacitor 1061 to charge. The charge on the capacitor biases the gate of the field effect transistor 1018 so that it is operating in the linear region. It acts as a variable resistor supplying current through the line 1020 and the resistor 1060 as well as the resistor 1061B to the base of the transistor 1046. This biases the transistor 1046 such that it can oscillate either in the presence of noise or in the presence of a signal.

In order to determine the difference between noise excitation causing the beginning of oscillation and signal excitation as well as noise excitation, a determination must be made as to when the amplitude of the oscillations from the oscillator 1044 reaches a preselected amplitude. The regenerative oscillator 1044 will increase its oscillation amplitude until it reaches a plateau or a saturation level.

It is most efficacious to be able to make the determination as to whether a signal or just noise is present on the basis of the interval between enabling the oscillator 1044 by the oscillator bias enable signal on the line 1016 and the time when the regenerative oscillator 1044 saturates as a result of the rate at which the oscillations increase. After the oscillator has been enabled, the output of the regenerative oscillator 1044 whose oscillation is caused by the capacitive divider pair 1050 and 1051, the capacitor 1050 is connected between the collector and the emitter of the transistor 1046. The capacitor 1050 is connected between the emitter and base of the transistor 1046. Both contribute to the oscillation as does a capacitor 1056 and an inductor 1055.

An averaging capacitor 1058 connected to a line 1070 effectively filters out a portion of the RF component to provide a more slowly changing signal to the transistor 1072. The transistor 1072 acts as a level detector by switching on when a predetermined voltage is reached indicating the regenerative oscillator 1044 is in saturation. A pulse which indicates saturation is supplied over the line 1100 to a gate array 1125 where timing has been taking place from the initiation of amplifier turn on as commanded by the gate array 1125 and the initiation of oscillation.

Figure 6C:
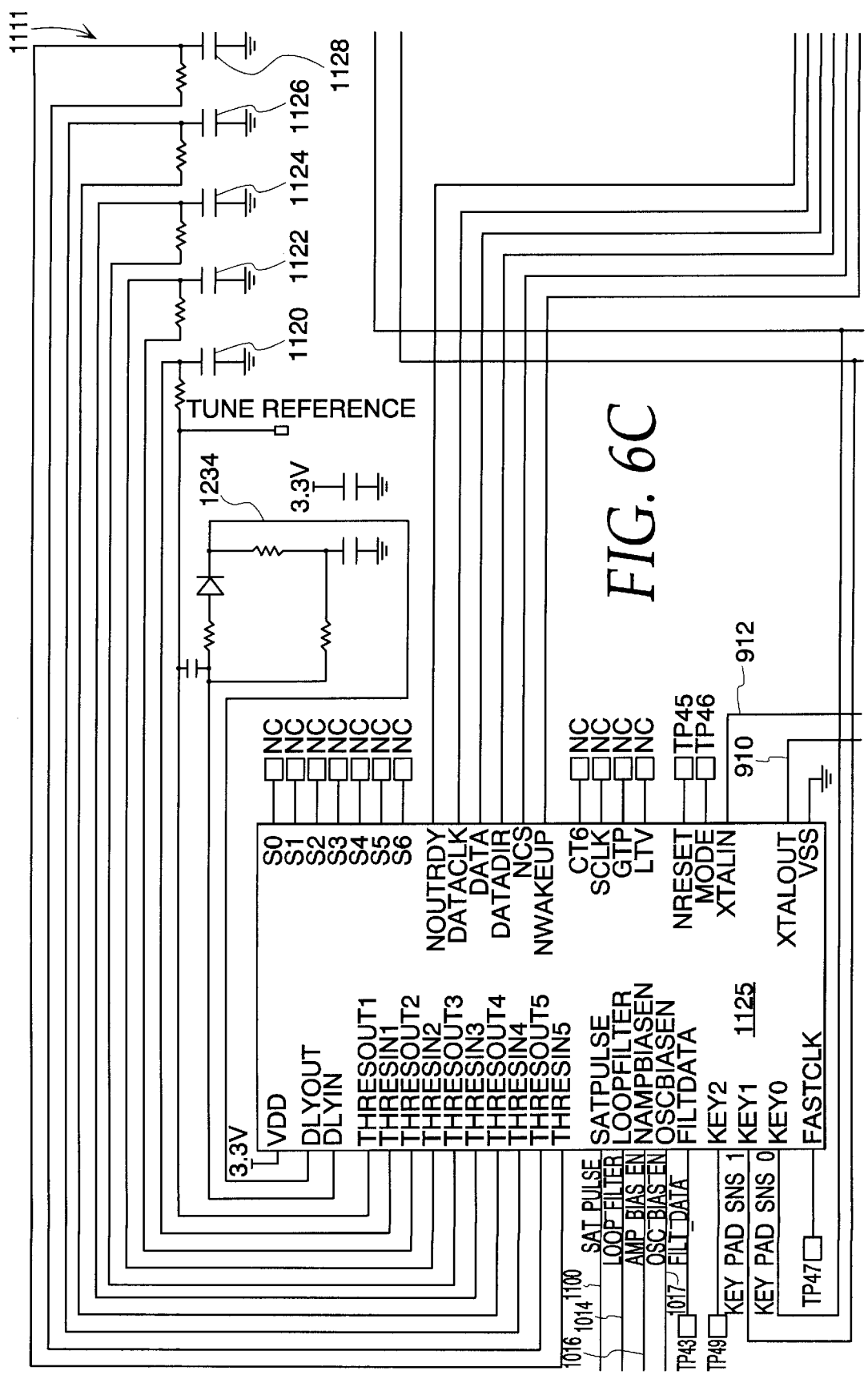
Figure 6D:
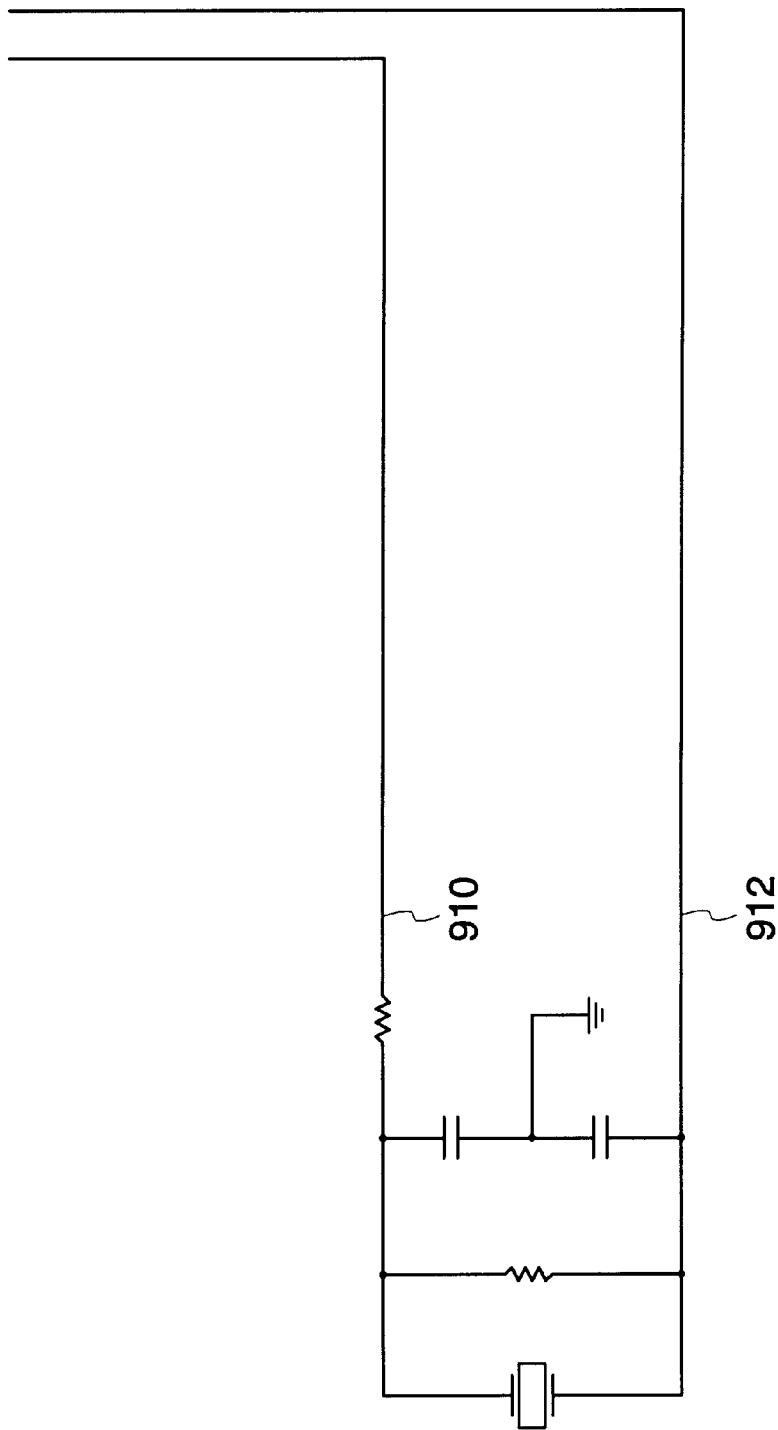
Figure 7:
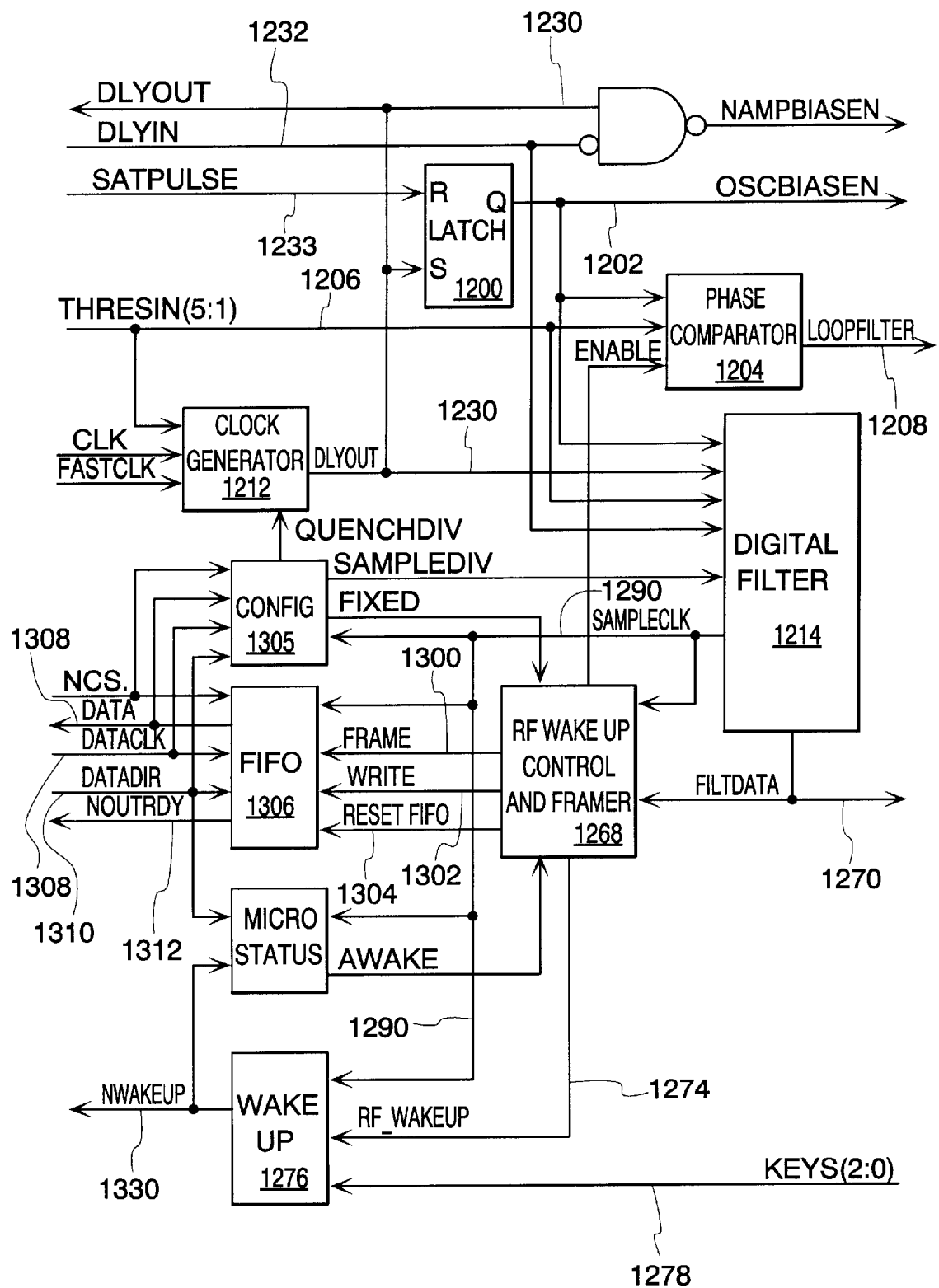
FIG. 7 is a block diagram of a gate array shown in FIG. 6C.

The saturation pulse on line 1100 (FIG. 6C) is received by the digital control 1004, specifically by the gate array 1125 (FIG. 6C). The saturation pulse is received by a flip-flop 1200 FIG. 7) which in response thereto shuts off the oscillator bias enable signal on a line 1202. The oscillator bias enable signal is fed by the line 1016 back to quench the regenerative oscillator 1044 and disable the preamplifier 1040.

At the same time, the pulse is fed to a phase comparator 1204 which receives signals from the threshold detectors 1110 on a THRESHOLDIN signal bus 1206. The signals on the bus 1206 are the instantaneous voltages of each of the RC timers. The phase comparator 1204 then, upon finding close coincidence in time between a preferred threshold voltage and the oscillator bias enable signal, produces a loop filter signal on a line 1208. The loop filter signal is then fed out on the line 1014 to the RF detector. The system operates under the control of a clock generator 1212 which drives the flip-flop 1200 as well as a digital filter 1214.

Figure 8:
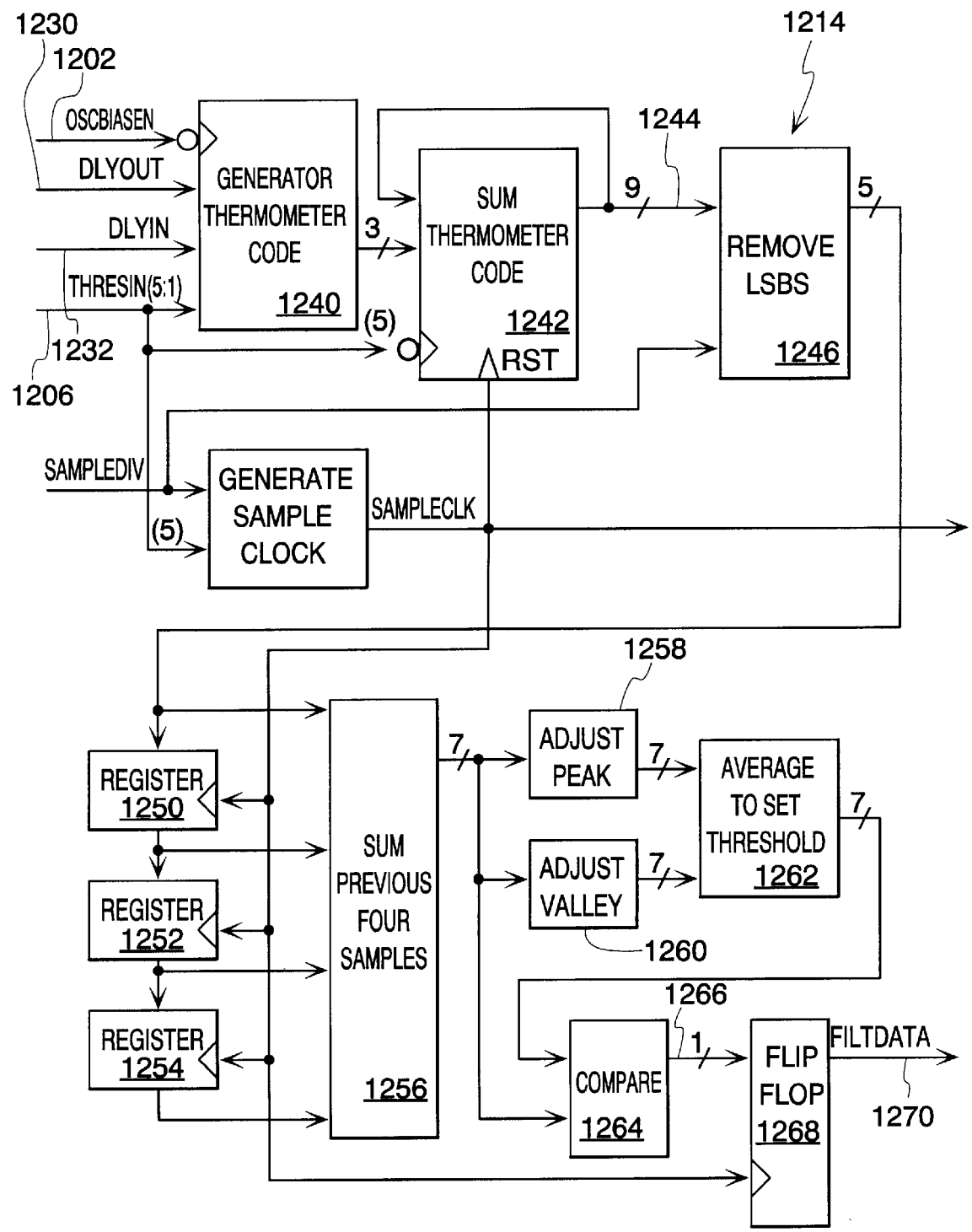
FIG. 8 a block diagram of a digital filter shown in FIG. 7.

As may best be seen in FIG. 8, the digital filter 1214 receives the oscillator bias enable signal on line 1202. A DLYOUT signal on a line 1230 from the clock generator 1212, a DLYIN signal on a line 1232 from a timing circuit 1234 and the threshold signal on the threshold bus 1206 are also received. When the saturation signal is received the voltage states of the five timers are compared to a fixed reference and respective zeroes and ones are output. For instance the earliest RC circuits to time will provide logical one signals and the last two might provide logical zero signals. The result numerical value of three would be encoded and a three bit number and is referred herein as a thermometer code. The three bit thermometer code is indicative of the relative timing between the saturation pulse having been produced by the RF detector and the selected threshold value. It indicates whether the threshold is relatively early or relatively late or the amount thereof. This in turn indicates the effective amplitude of the signal received by the RF detector and whether the RF detector has received a signal or is oscillating solely as a result of noise.

The three bit thermometer code is fed to a summing circuit 1242 which provides a summed thermometer code digital output on a line 1244 to a logic circuit 1246 which removes the least significant bit of the summed thermometer code. The summed thermometer code represents the average saturation over the last few enable-disable cycles of the regenerative oscillator 1044.

Those codes are passed to a plurality of registers 1250, 1252 and 1254 and stored therein so that the most recent thermometer code summed is summed with the previous four samples in a summer 1256 to provide a longer term averagde thermometer code indicative of the relative noise floor for the received signals.

A peak value adjustment is made in the peak adjuster 1258. A miminum value adjuster 1260 makes an adjustment and feeds an averaging circuit 1262. The averaging circuit 1262 determines an average of the highest and lowest codes to produce a midrange or span theremometer code value which is then compared to the sum in a comparator circuit 1264. In the event that the comparison is positive, indicating that a transmitter signal has been received or legitimate continuous wave modulated pulse has been received, an output is provided on a line 1266. This causes a flip-flop 1268 to latch providing a bit or high signal on a line 1270 indicating that a legitimate RF signal has been received. That received code signal is fed to an RF wakeup control which feed produces an output enable signal that is sent to the phase comparator 1204. The wakeup circuit 1276 (FIG. 7) is responsive to key pushes from a keyboard which keypush signals are carried on a line 1278 and to a sample clock signal from the digital filter on a line 1290. The framer 1268 stores a series of bits and writes out a frame of data on a bus or line 1300. It also produces a write enable signal 1302 and a FIFO signal 1304. The FIFO signal commands a first in first out storage device, such as a shift register 1306, to be ready to receive the data in the frame. The data may then be supplied on a data line 1308 to other portions of the circuit. The first in first out register 1306 is responsive to a data clock signal on a data clock line 1308 and to a data direction signal on a line 1310. A ready signal is supplied on line 1312. All of those signals are supplied to the microcontroller 1006 (FIG. 5). If the gate array processes a signal that does not have the expected code characteristics in terms of pulse width it will flush the FIFO via a reset signal.

The wakeup circuit 1276 supplies a wakeup signal on a line 1330 in response to receiving five bits of properly found data or a key command in combination with a sample clock signal. The data may be clocked into the microcontroller 1006 in frame format where the microcontroller 1006 can interpret the data received. It does so by determining whether the data or code received is from a legitimately formatted transmitter, irrespective of whether a fixed code, or a rolling code is used. The microcontroller 1006 can from time to time cause identity information to be stored in the electrically erasable programmable read only memory 1007 and may access that information for the making of an authorization check on the received code.

A config or configuration circuit 1305 receives signals from the microcontroller 1006 to control other portions of the gate array 1125. In response to the microcontroller 1006 recognizing the type of code received, i.e., fixed code or rolling, the microcontroller signals the config circuit 1305 to configure the gate array 1125 to process that type of code in the future. Depending the code frame size, which affects the code rate the rate at which the oscillator and amplifier can be selected to be one of either every one-sixteenth millisecond or one-eighth millisecond.

Thus what has been provided is a superegenerative receiver that is both noise immune and sensitive while using little power. In addition the circuit is to a great extent embodied in integrated circuits for low cost.

Figure 6E:
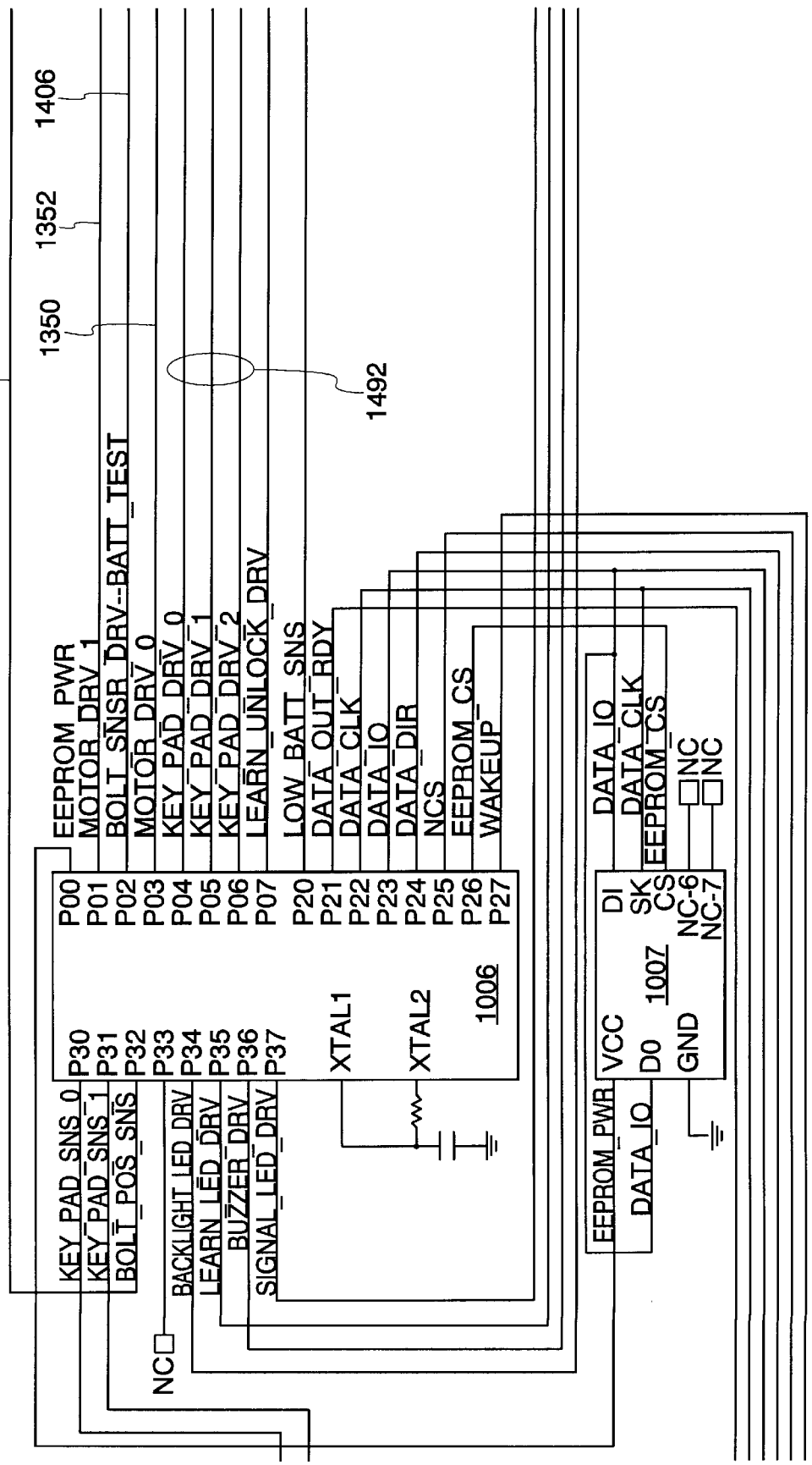
Figure 6F:
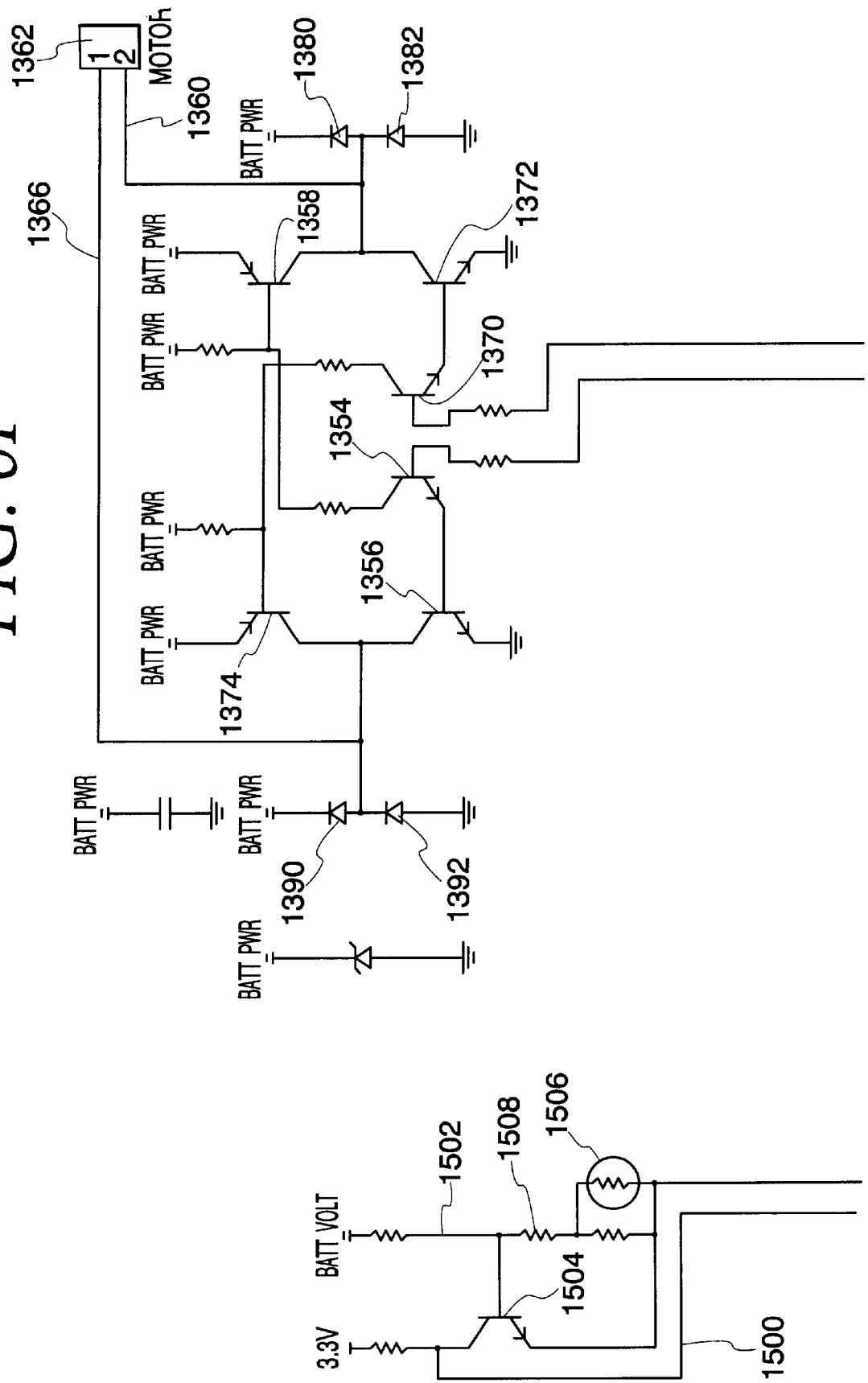
Figure 6G:
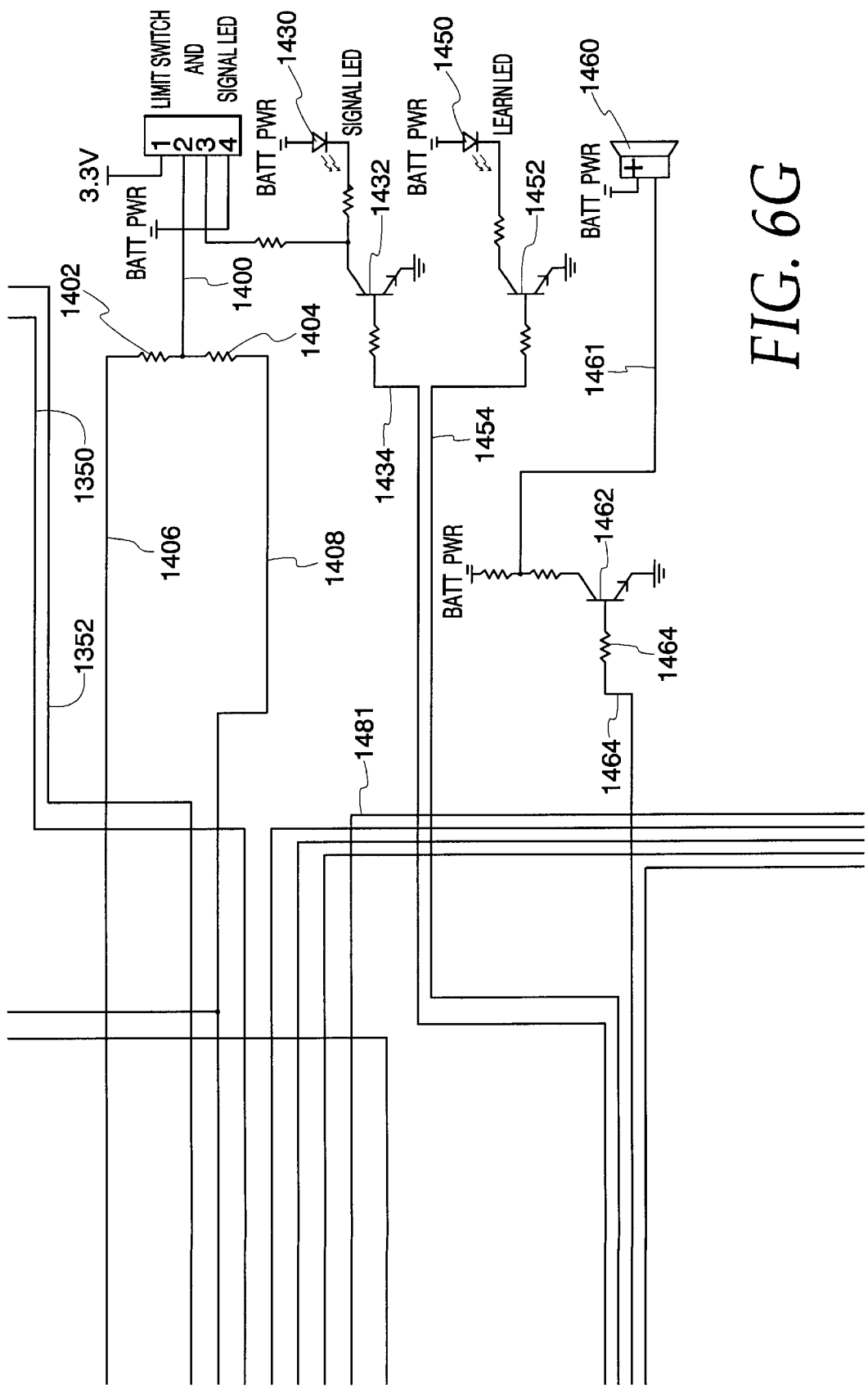
Figure 6H:
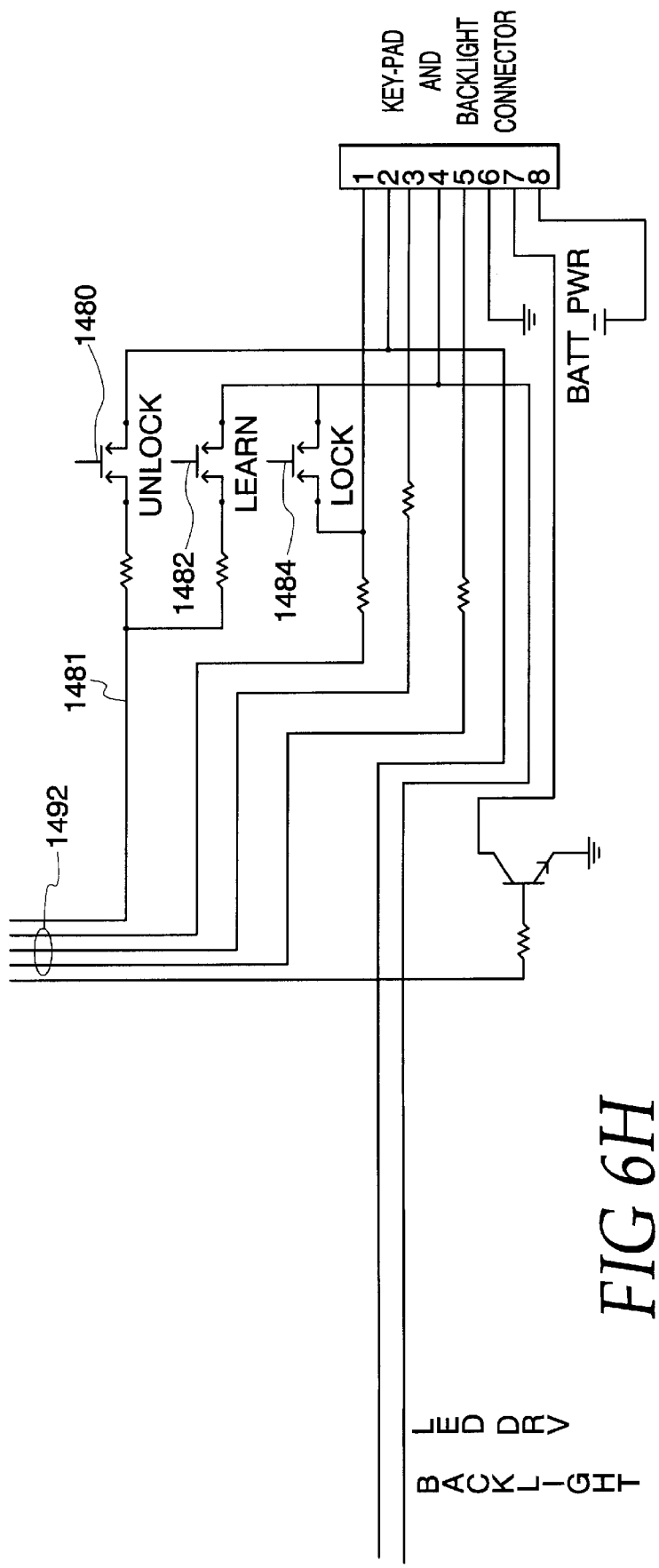

Assuming that the code has emanated from an authorized transmitter and indicates that an action is to be taken, signals are sent from the microcontroller on a pair of motor control lines 1350 and 1352 (FIG. 6E). Signals do not appear simultaneously on both lines.

Motor control line 1350 is connected to a control transistor 1354 which when switched on causes a transistor 1356 and a transistor 1358 to become conducting, allowing current to flow from the transistor 1358 out through a power line 1360 to a connector 1362 which is coupled to a motor 1364. Current flows back in through a line 1366 and then a line 1368 and is received by the transistor 1356 where it is conducted to ground. This causes the motor to turn in one direction.

In the event it is desired for the motor to turn in the opposite direction, the line 1352 has a signal placed upon it causing a transistor 1370 to be switched on thereby switching on a transistor 1372 and a transistor 1374. Current flows from the battery supply through transistor 1374 out through leads 1368 and 1366 through the connector 1362 to the motor 1364 and back in through the lead 1360 to the transistor 1372, where it is delivered to ground. A first pair of protected diodes 1380 and 1382 protect the transistors 1358 and 1372. A pair of diodes 1390 and 1392 protect the transistors 1356 and 1374.

It may be appreciated that the microcontroller 1006 can receive signals from limit switches or the like through a line 1400 (FIG. 6G) by a pair of resistors 1402 and 1404 to leads 1406 and 1408 connected to the microcontroller. The microcontroller 1006 can cause a light emitting diode 1430 to be illuminated by switching a transistor 1432 on via a control signal controlled on a line 1434 through a resistor 1436. Likewise, if the microcontroller 1006is placed in a learn mode, whereby it stores information which enables it to identify an authorized transmitter such as an authorization code, a fixed code, a rolling code or the like, a learn LED 1450 is illuminated by a transistor 1452 switching on under the control of the microcontroller 1006 via a lead 1454.

A speaker or annunciator 1460 is provided to provide an output indication to the user indicating that the RF detector has received a legitimate signal from a transmitter. The annunciator 1460 is controlled by a transistor 1462 coupled through a resistor 1464 to a buzzer drive and from the microcontroller 1006. The microcontroller 1006 also can receive specific inputs from a manual unlock button 1480, from a manual learn button 1482 and from a manual lock button 1484. A keypad is connected through a keypad connector 1490 (FIG. 6H) and a plurality of keypad lines 1492 to the microcontroller providing user access with the keypad code.

The microcontroller 1005 also senses battery voltage from a battery voltage line 1500, which is part of the battery voltage sensing circuit 1502 (FIG. 6F) adapted to be connected to a 3.3-volt potential or the type of potential supplied by two AA batteries. The circuit relies upon the base emitter drop of the transistor 1504. However, because the base emitter drop of the transistor 1504 is temperature-dependent and the receiver may be used in applications out of doors causing changes in the voltage due to temperature, the thermistor 1506 is provided in a compensating circuit 1508, which compensates for the base-emitter voltage change.

A power supply circuit is provided having approximately a 10 microampere bias current. The power supply circuit 1510 (FIG. 6B) provides temperature-compensated and regulated voltage to other portions of the circuit. Temperature compensation is provided by a thermistor 1512.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

What is claimed is:

1. A super-regenerative digital radio frequency receiver for receiving a radio frequency signal comprising:
   a regenerative radio frequency oscillator for receiving radio frequency signals and for oscillating in response thereto and producing an oscillator signal;
   an enable circuit coupled to said radio frequency oscillator for enabling oscillations of the radio frequency oscillator from time to time;
   a multi-level threshold detecting circuit coupled to receive an output of the radio frequency oscillator, the threshold detecting circuit receiving the radio frequency signal and determining when the radio frequency signal from the radio frequency oscillator due to increasing oscillation therein exceeds a threshold, the threshold detecting circuit providing a threshold output signal as a result thereof, the multi-level threshold detector circuit being coupled to the enable circuit to disable the radio frequency oscillator; and
   a digital detector connected to the output of the threshold detector for providing a bit signal therefrom in response to the digital detector receiving at least n of m recent threshold output signals.

2. A super-regenerative receiver according to claim 1 further comprising a framing circuit for combining bits in response to the bit signal received from the digital detector circuit into data frames.

3. A super-regenerative radio frequency receiver according to claim 2 wherein the threshold for the threshold detector may be dynamically set in response to outputs from the threshold detector.

4. A super-regenerative receiver according to claim 1 wherein the output bit signal controls the response of a motor control circuit connected thereto, said motor control circuit being adapted to provide output current to an electric motor.

5. A receiver for receiving a digitally coded radio frequency signal from a transmitter, comprising:
   an RF detector for detecting the digitally coded radio frequency signal and for generating a digital signal responsive to the digitally coded radio frequency signal, the RF detector comprising an analog amplifier coupled to an analog oscillator for generating an analog oscillator signal and a digital signal generator responsive to the analog oscillator signal for producing a digital signal;
   a clock signal generator for producing a clock signal;
   a delayed clock signal generator for generating a first plurality of offset clock signals and a second offset clock signal in response to the clock signal; and
   a first comparator for comparing the combined one of the first plurality of clock offset signals and the second offset clock signal with the digital signal and producing a combination clocked and analog bias signal and supplying the combination clocked and analog bias signal to the oscillator to stabilize the oscillator timing; and
   a second comparator for comparing the first offset signal with the digital signal and generating a detected code signal in response thereto.

6. A receiver according to claim 5, further comprising a majority pulse detector coupled to receive the detected code signal and for producing an accepted code signal in response to receipt of a predetermined number of code signals.

* * * * *